(12) United States Patent
Yang et al.

(10) Patent No.: US 9,846,464 B2
(45) Date of Patent: Dec. 19, 2017

(54) POWER SUPPLY SYSTEM AND CONTROL METHOD THEREOF

(71) Applicant: LITE-ON TECHNOLOGY CORPORATION, Taipei (TW)

(72) Inventors: Zih-Min Yang, New Taipei (TW); Ting-Hsi Huang, New Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 181 days.

(21) Appl. No.: 14/794,872

(22) Filed: Jul. 9, 2015

(65) Prior Publication Data

US 2016/0011650 A1    Jan. 14, 2016

(30) Foreign Application Priority Data

Jul. 11, 2014    (TW) .............................. 103123996 A

(51) Int. Cl.
  *G06F 1/26* (2006.01)
  *G06F 1/32* (2006.01)
  *G01R 21/06* (2006.01)
  *G01R 31/42* (2006.01)
  *H02J 9/00* (2006.01)
  *H02J 1/10* (2006.01)

(52) U.S. Cl.
  CPC ............ *G06F 1/263* (2013.01); *G06F 1/3206* (2013.01); *G01R 21/06* (2013.01); *G01R 31/42* (2013.01); *H02J 1/10* (2013.01); *H02J 9/005* (2013.01); *Y10T 307/391* (2015.04); *Y10T 307/582* (2015.04); *Y10T 307/707* (2015.04); *Y10T 307/724* (2015.04); *Y10T 307/729* (2015.04)

(58) Field of Classification Search
  CPC ....... G06F 1/263; G06F 1/3206; G01R 21/06; G01R 31/42; H02J 1/10; H02J 9/005; Y10T 307/391; Y10T 307/582; Y10T 307/707; Y10T 307/724; Y10T 307/729
  See application file for complete search history.

(56) References Cited

U.S. PATENT DOCUMENTS 5,675,480 A  * 10/1997  Stanford ............... H02M 3/285
                                                     307/58
2003/0080624 A1* 5/2003 Belson ...................... H02J 1/10
                                                     307/85

(Continued)

*Primary Examiner* — Terrell Johnson
(74) *Attorney, Agent, or Firm* — Li & Cai Intellectual Property (USA) Office

(57) ABSTRACT

The instant disclosure provides a power supply system and control method thereof. The power supply system comprises at least two power supplies electrically coupled in parallel. The control unit of the power supply generates a wake-up signal or a sleep signal according to the loading status. A second communication port of each power supply is coupled to a first communication port of the next stage power supply to establish cascading communications architecture. The first communication port receives a wake-up signal from the second communication port of the previous stage power supply and outputs a sleep signal to the second communication port of the previous stage power supply. The second communication port receives the sleep signal from the first communication port of the next stage power supply and outputs the wake-up signal to the first communication port of the next stage power supply.

20 Claims, 13 Drawing Sheets

(56) References Cited

U.S. PATENT DOCUMENTS

| | | | |
|---|---|---|---|
| 2011/0191612 A1* | 8/2011 | Itakura | H02J 3/005 713/320 |
| 2014/0049108 A1* | 2/2014 | Hsu | H02J 3/06 307/52 |
| 2014/0268912 A1* | 9/2014 | Telefus | H02J 7/025 363/21.12 |
| 2015/0177805 A1* | 6/2015 | Yeh | H02J 9/061 713/300 |
| 2015/0338891 A1* | 11/2015 | Cain, III | G06F 1/183 307/39 |

* cited by examiner

POWER SUPPLY SYSTEM AND CONTROL METHOD THEREOF

BACKGROUND OF THE INVENTION

1. Field of the Invention

The instant disclosure relates to a power supply; in particular, to a power supply system and a control method thereof.

2. Description of Related Art

Please refer to FIG. 1 showing a schematic diagram of a conventional 1+1 redundant power supply system. The conventional 1+1 redundant power supply system 1 comprises power supplies 11, 12 parallel electrically connected to output electrical power to a load 2, wherein the output voltages V1, V2 and the output currents I1, I2 of the power supplies 11, 12 are adjustable. The power supplies 11, 12 respectively have load share control circuits 111, 112, wherein the load share control circuits are electrically connected to a load share bus LSB. To balance load, each power supply in a redundant configuration may have a load share signal that may couple to the load share bus LSB coupled between power supplies. Each power supply may be designed and configured to drive the power line to a voltage proportional to its output current (power). Each power supply may monitor the load share bus LSB and attempt to raise or lower its output current to match the voltage on the load share bus LSB. In this way, the load may be shared between the two or more power supplies. Conventionally, the power supplies 11, 12 are configured with a Master-slave relation, for example the power supply 11 is the master power supply and the power supply 12 is the slave power supply. The load share control circuits 111, 112 are for receiving the load share signal of the load share bus LSB, the load share signal represents the output loading of the respective power supply. When the system loading is lower than a predetermined lower-limit (such as lower than 60% of system loading), the master power supply (11) would inform the slave power supply (12) to enter a sleep mode, for saving energy. When the system loading is higher than a predetermined upper-limit (such as higher than 70% of system loading), the master power supply (11) would inform the slave power supply (12) to enter an active mode, for saving energy.

However, the conventional technology only can be applied to the 1+1 redundant power supply system (which only has two power supplies in the system). When the system is an N+1 redundant power supply system (in which N is an integer greater than 1), the number of the power supplies is not invariant, thus the conventional control strategy can not be applied to conduct the energy-saving mechanism correctly.

SUMMARY OF THE INVENTION

The object of the instant disclosure is to provide a power supply system and a control method thereof to provide a redundant power supply system and method without master-slave mechanism, for switching the operation of the power supplies according to the system loading status, so as to save energy.

In order to achieve the aforementioned objects, according to an embodiment of the instant disclosure, a power supply system is provided. The power supply system comprises at least two power supplies. The power supplies are electrically connected to a load share bus, and electrically coupled in parallel to output electrical power to a load. Each power supply dynamically operates in either an active mode or a sleep mode according to the loading status. One of the power supplies is a determining-stage power supply of the power supplies operating in the active mode. Each power supply comprising a control unit, a first communication port and a second communication port. The control unit electrically coupled to the load share bus generates a wake-up signal or a sleep signal according to a load share signal from the load share bus. The load share signal indicates the loading status of the power supply system, wherein when operation of the power supply changes from the sleep mode to the active mode, the control unit controls the power supply to operate from the sleep mode to the active mode according to the wake-up signal from a previous stage power supply, wherein when the operation of the power supply changes from the active mode to the sleep mode, the control unit generates the sleep signal. The first communication port is coupled to the control unit. The second communication port is coupled to the control unit, wherein the first communication port of each power supply is coupled to the second communication port of the previous stage power supply, the second communication port of each power supply is coupled to the first communication port of the next stage power supply to establish a cascading communication architecture. The first communication port is for receiving the wake-up signal of the second communication port of the previous stage power supply and outputting the sleep signal to the second communication port of the previous stage power supply. The second communication port is for receiving the sleep signal of the first communication port of the next stage power supply and outputting the wake-up signal to the first communication port of the next stage power supply.

In order to achieve the aforementioned objects, according to an embodiment of the instant disclosure, a control method of a power supply system adapted for the power supply system is provided. The power supply system comprises at least two power supplies. The power supplies are electrically connected to a load share bus, and electrically coupled in parallel to output electrical power to a load. Each power supply dynamically operates in either an active mode or a sleep mode according to the loading status. One of the power supplies is a determining-stage power supply of the power supplies operating in the active mode. Each power supply comprises a first communication port and a second communication port. The first communication port of each power supply is coupled to the second communication port of the previous stage power supply. The second communication port of each power supply is coupled to the first communication port of the next stage power supply to establish a cascading communication architecture. The control method comprises: assigning the power supplies to provide electrical power to the load according to a load share signal of the load share bus; controlling the determining-stage power supply of the power supplies operating in active mode to output a wake-up signal through the second communication port to the first communication port of the next stage power supply for controlling the operation of the next power supply from the sleep mode to the active mode when the load share signal is greater than a first threshold; and controlling the determining-stage power supply power supply of the power supplies operating in the active mode to operate in the sleep mode and output a sleep signal through the first communication port to the second communication port of the previous stage power supply when the load share signal is less than a second threshold.

In summary, a power supply system and a control method thereof are provided, wherein a cascading communication architecture is established by a plurality of power supplies with the same hardware and software architecture, and operations of the power supplies are switched according to the loading status obtained from the load share bus, thereby the consumed energy can be saved.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

[An Embodiment of a Power Supply System]

Figure 1:
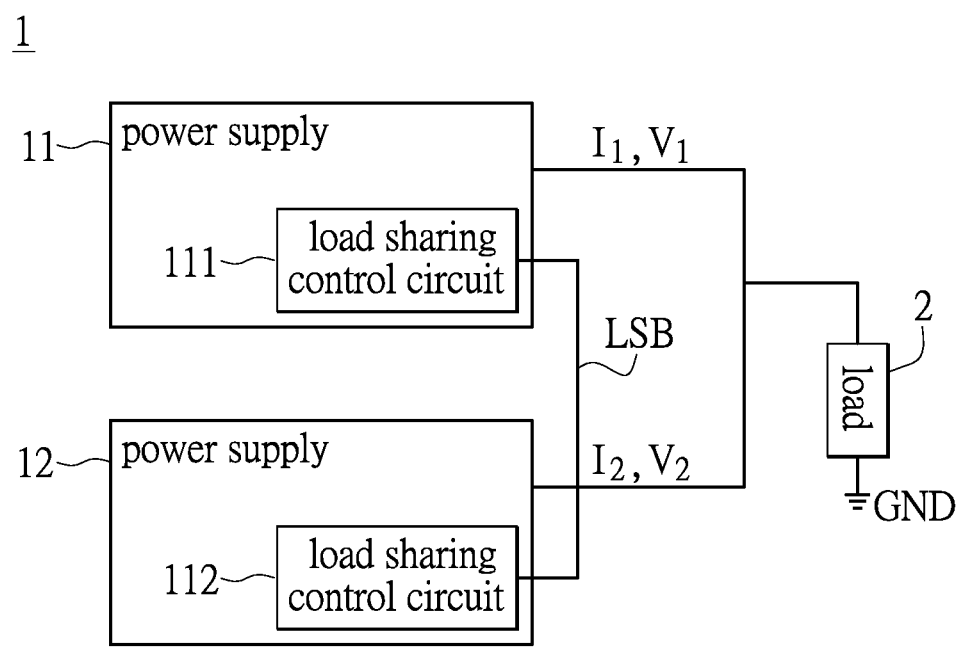
FIG. 1 shows a schematic diagram of a conventional 1+1 redundant power supply system.
Figure 2A:
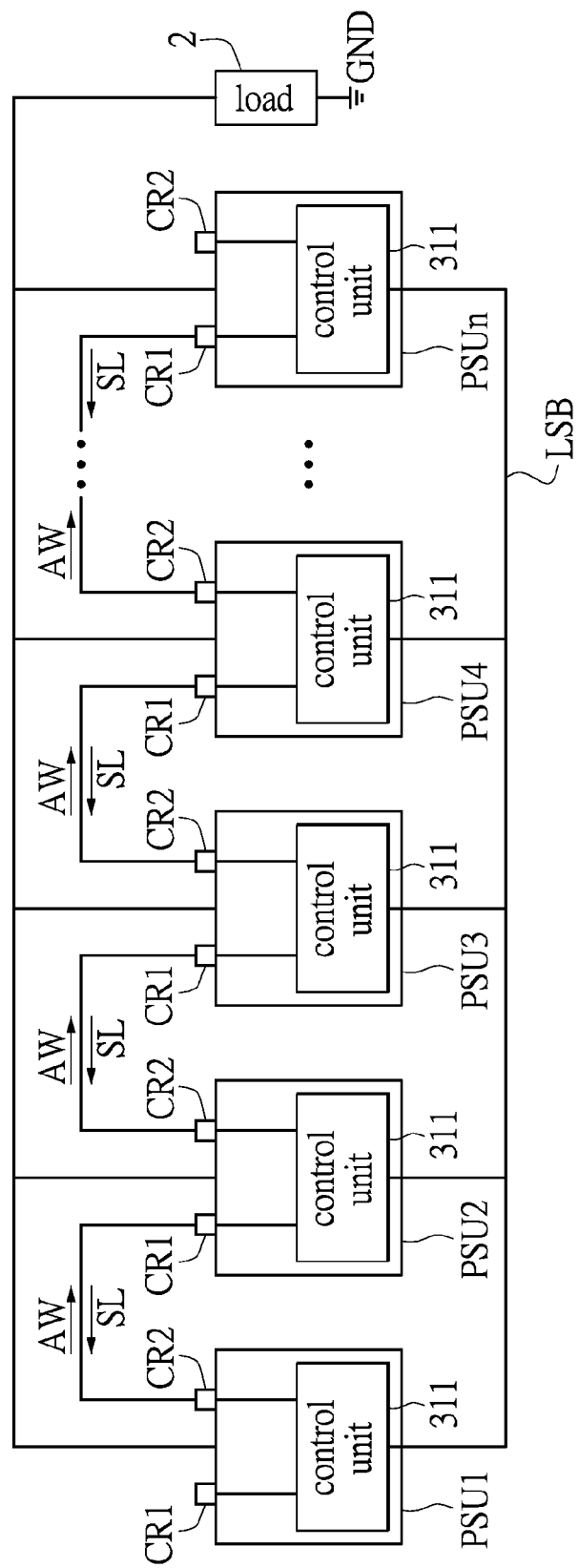
FIG. 2A shows a circuit block diagram of a power supply system according to an embodiment of the instant disclosure.

Please refer to FIG. 2A showing a circuit block diagram of a redundant power supply system according to an embodiment of the instant disclosure. The redundant power supply system comprises at least two power supplies, for example the power supply system 3 comprises N power supplies which respectively are power supplies PSU1, PSU2, PSU3, PSU4 . . . PSUn as shown in FIG. 2A. However, the number of the power supplies included in the power supply system is not to be limited. The power supplies PSU1, PSU2, PSU3, PSU4 . . . PSUn are parallel electrically connected to output electrical power to the load 2. Each power supply may operate in an active mode or a sleep mode. Each power supply comprises a control unit 311, a first communication port CR1 and a second communication port CR2. Besides, the voltage converter of the power supply itself for outputting electrical power and the related power circuit are omitted in FIG. 2A.

The control unit 311 of each power supply is electrically coupled to the load share bus LSB. The first communication port CR1 and the second communication port CR2 are coupled to the control unit 311. The first communication port CR1 of each power supply is coupled to the second communication port CR2 of the previous stage power supply, and the second communication port CR2 of each power supply is coupled to the first communication port CR1 of the next stage power supply to establish a cascading communication architecture. In detail, the second communication port CR2 of the power supply PSU1 is coupled to the first communication port CR1 of the next stage power supply PSU2 (that is the first communication port CR1 of the power supply PSU2 is coupled to the second communication port CR2 of the previous stage power supply PSU1). The second communication port CR2 of the power supply PSU2 is coupled to the first communication port CR1 of the next stage power supply PSU3. The second communication port CR2 of the power supply PSU3 is coupled to the first communication port CR1 of the next stage power supply PSU4. The second communication port CR2 of the power supply PSU4 is coupled to the first communication port CR1 of the next stage power supply (PSU5 which is not shown in the figure), and so on. In the same way, the first communication port CR1 of the last power supply PSUn is coupled to the second communication port CR2 of the previous stage power supply (PSUn-1 which is also not shown in the figure).

Each control unit 311 can generate a wake-up signal AW or a sleep signal SL according to a load share signal from the load share bus LSB. The load share signal indicates the loading status of the power supply system 3. In one embodiment, the load share signal may be a voltage, and the voltage is proportional to the loading of the power supply system 3. However, the instant disclosure does not limit the type and the content of the load share signal, an artisan of ordinary skill in the art will appreciate how to design of the load share bus LSB and the related load share signal, thus there is no need to go into details. The control unit 311 of this embodiment comprises the function of the load share control circuit 111 (or 112) mentioned above, and please refer to descriptions hereinafter for other functions of the control unit 311 of this embodiment.

When the operation of the power supply PSU1 (or PSU2, or PSU3, or PSU4, or PSUn) changes from the sleep mode to the active mode, the control unit 311 of the power supply PSU1 (or PSU2, or PSU3, or PSU4, or PSUn) controls the operation of the power supply PSU1 (or PSU2, or PSU3, or PSU4, or PSUn) to change from the sleep mode to the active mode according to the wake-up signal AW. When the operation of the power supply PSU1 (or PSU2, or PSU3, or PSU4, or PSUn) changes from the active mode to the sleep mode, the control unit 311 of the power supply PSU1 (or PSU2, or PSU3, or PSU4, or PSUn) generates the sleep signal SL.

In this embodiment, the first communication port CR1 is for receiving the wake-up signal AW generating from the second communication port CR2 of the previous stage power supply and outputting the sleep signal SL to the second communication port CR2 of the previous stage power supply. In other words, the second communication port CR2 is for receiving the sleep signal SL generating from the first communication port CR1 of the next stage power supply and outputting the wake-up signal AW to the first communication port CR1 of the next stage power supply.

The first communication port CR1 and the second communication port CR2 may be designed depending on practical applications. For example, the first communication port CR1 and the second communication port CR2 may be digital communication ports, such as serial buses, or parallel buses, however the type of the first communication port CR1 and the second communication port CR2 are not to be limited.

Figure 2B:
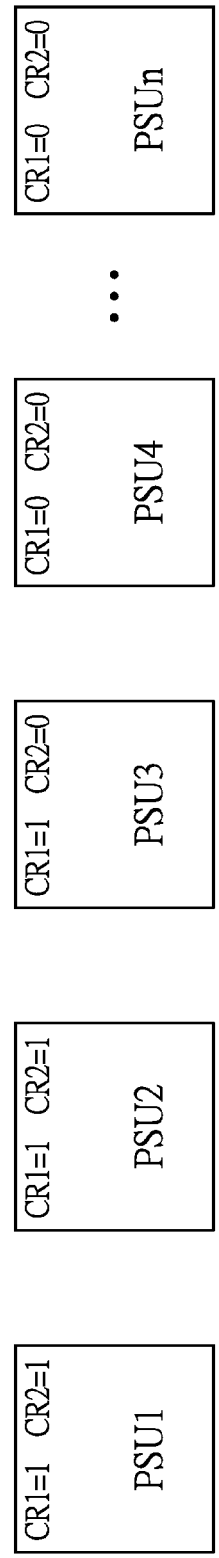
FIG. 2B shows a schematic diagram of the power supplies logical status of the power supply system according to an embodiment of the instant disclosure.

Please refer to FIG. 2B showing a schematic diagram of the power supplies logical status of the power supply system according to an embodiment of the instant disclosure. When the power supply system 3 initially starts-up, the power supplies PSU1, PSU2, PSU3, PSU4 . . . PSUn can be set to active mode, thereafter a portion of the power supplies can be changed to sleep mode according to the loading status. For details of mode switch of the power supplies PSU1, PSU2, PSU3, PSU4 . . . PSUn refer to the descriptions in subsequent embodiments of FIGS. 6A, 6B, 6C and FIGS. 7A, 7B, 7C. The logic state of the first communication port CR1 and the second communication port CR2 will be described first according to the operation modes of the power supplies. In this embodiment, the first communication port CR1 and the second communication port CR2 output (or input) a voltage level, and when the voltage level is "High" it represents a high logic state (in programmer's language, a "1"), and when the voltage level is "Low" it represents a low logic state (in programmer's language, a "0"). Referring to FIG. 2B, for example, power supplies PSU1, PSU2, PSU3 are set to active mode according to the loading status, and power supplies PSU4 . . . PSUn are set to sleep mode, meanwhile the logic state of the first communication port CR1 of the power supply PSU1 is "1", the logic state of the second communication port CR2 of the power supply PSU1 is "1", the logic state of the first communication port CR1 of the power supply PSU2 is "1", the logic state of the second communication port CR2 of the power supply PSU2 is "1". And, the power supply PSU3 is the last stage of the power supplies PSU1, PSU2, PSU3 operating in active mode, wherein the logic state of the first communication port CR1 of the power supply PSU3 is "1", the logic state of the second communication port CR2 of the power supply PSU3 is "0". The logic state of the first communication port CR1 and the second communication port CR2 of the power supplies PSU4 . . . PSUn operating in sleep mode are both "0". According to the above example, among all power supplies PSU1, PSU2, PSU3, PSU4 . . . PSUn of the power supply system 3, only one power supply (for example the power supply PSU3 in FIG. 2B) has different logic state of the first communication port CR1 and the second communication port CR2, which is also called a determining-stage power supply and this power supply is the last stage of the power supplies (PSU1, PSU2, PSU3) operating in active mode.

Specifically, referring to FIG. 2B for example, the power supply PSU3 is the last stage of the power supplies PSU1, PSU2, PSU3 operating in active mode, and the power supply PSU3 can enter sleep mode (and inform the previous stage power supply PSU2) or wake-up the next stage power supply PSU4 according to the loading status, meanwhile operation modes of other power supplies are not affected by the power supply PSU3. In practical operations of the circuit, for the cascading communication architecture of the power supplies PSU1, PSU2, PSU3, PSU4 . . . PSUn, the power supplies PSU1, PSU2, PSU3 may enter the sleep mode in reverse order according to the decrease of the loading. On the other hand, the power supplies PSU1, PSU2, PSU3 may sequentially enter the active mode according to the increase of the loading. Furthermore, when the loading increases further, the power supplies PSU4 . . . PSUn may sequentially enter the active mode according to increase of the loading. For example, when the power supply system 3 initially starts up, the power supplies PSU1, PSU2, PSU3, PSU4 . . . PSUn are all set to active mode, meanwhile the power supply PSUn is the last stage of the power supplies PSU1, PSU2, PSU3, PSU4 . . . PSUn operating in active mode. At this time, the logic state of the first communication port CR1 of the power supply PSUn is "1", and the logic state of the second communication port CR2 of the power supply PSUn is "0". When the power supply system 3 initially starts up, all power supplies can be set to active mode and output full power (100% power). Then the control unit 311 of the last stage power supply PSUn determines whether the actual loading is less than 100% power. When the loading is less than 100% power, the operation mode of the power supply PSUn can be switched to sleep mode, and meanwhile the first communication port CR1 of the power supply PSUn outputs the sleep signal SL to the second communication port CR2 of the previous stage power supply PSUn-1. Specifically, when the control unit 311 of the power supply PSUn determines the load share signal is less than a predetermined threshold, the control unit 311 of the power supply PSUn outputs the sleep signal SL through the first communication port CR1 to the second communication port CR2 of the previous stage power supply PSUn-1, and the control unit 311 controls the operation of the power supply PSUn itself to switch from active mode to sleep mode, meanwhile the logic state of the first communication port CR1 and the second communication port CR2 can be set to "0". Accordingly, the last stage power supply of the power supplies operating in active mode is changed to be the power supply PSUn-1, wherein the logic state of the first communication port CR1 of the power supply PSUn-1 is "1", the logic state of the second communication port CR2 is changed to "0" due to receiving the sleep signal SL from the first communication port CR1 of the power supply PSUn. Therefore, the power supply PSUn-1 plays the role of determining whether to wake-up the next stage power supply PSUn (when the loading increases) or inform the previous stage power supply PSUn-2 and switch the power supply PSUn-1 itself to sleep mode (when the loading decreases) according to the loading status. Further, when the loading further decreases, the power supplies PSUn-1, PSUn-2, PSUn-3 . . . can enter sleep mode in reverse order, for example go to the logical status shown in FIG. 2B. On the other hand, when the load share signal is greater than a predetermined threshold, the control unit 311 of any power supply (excluding the last power supply PSUn) which represents the last stage power supply of the power supplies operating in active mode can output the wake-up signal AW through the second communication port CR2 to the first communication port CR1 of its next stage power supply, so as to switch the operation of its next stage power supply from sleep mode to active mode. It is worth mentioning that the number of aforementioned thresholds can be plural according to the number of the power supplies.

Figure 3:
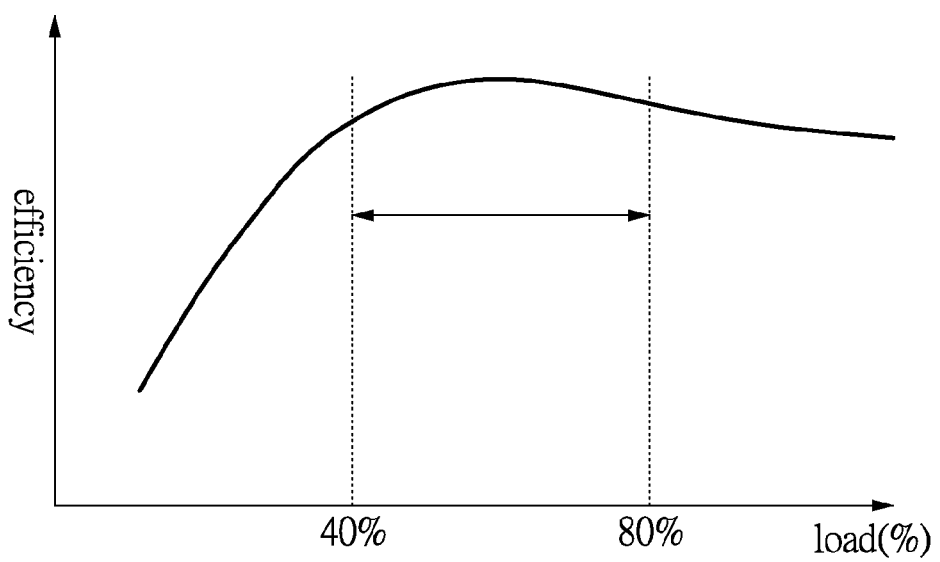
FIG. 3 shows a graph of the load versus the efficiency of the power supply according to an embodiment of the instant disclosure.

Please refer to FIG. 3 showing a graph of the load versus the efficiency of the power supply according to an embodiment of the instant disclosure. The efficiency of each power supply varies according to the loading, and a certain loading range can be expected with higher efficiency in general, such as in the range of about 40% to about 80% of full loading which has higher efficiency (as shown in FIG. 3). In order to make each power supply operate in the loading range with higher efficiency if possible, the control unit 311 of the power supply may be configured with at least one threshold, for example, which sets at an 80% of full loading corresponding to a high loading status, and the load share signal can be compared with the predetermined threshold for determining whether to control the power supply itself to enter sleep mode or wake-up the next stage power supply so as to make the power supplies operating in active mode operate with higher efficiency, wherein the threshold can be a voltage value, the threshold voltage represents a predetermined percentage of full loading of the power supply system. Referring to FIG. 3, two power supplies PSU1, PSU2 included in the power supply system 3 are taken as an example in this embodiment, when there is only the power supply PSU1 outputting electrical power, at this time the system loading is the loading of the power supply PSU1, if the predetermined threshold is 80% of full loading, the power supply PSU1 can operate in higher efficiency when the system loading is between 40%-80%. When the system loading is higher than the threshold, the efficiency of the power supply PSU1 would decrease, at this time the power supply PSU2 can be awakened, such that each of the power supplies PSU1, PSU2 can share 40% (or more) of the system loading. Even if the system loading further increases, each of the power supplies PSU1, PSU2 can individually operate in high efficiency range between 40%-80% loading. Otherwise, when the system loading is lower than the threshold again, the loading of each of the power supplies PSU1, PSU2 providing electrical power in parallel would be lower than 40% of the system loading, such that the efficiency of each of the power supplies PSU1, PSU2 would decrease, at this time the power supply PSU2 can be switched to sleep mode so as to make the electrical power provided to the load to be only from the power supply PSU1. Additionally, the number of the thresholds can be increased according to the number of parallel electrically connected power supplies, and the operation of the scenario of more than two power supplies can be obtained accordingly. As a result, according to the predetermined thresholds, the power supplies operating in active mode could operate in high efficiency. The values and the number of the thresholds are not limited in the instant disclosure.

Figure 4:
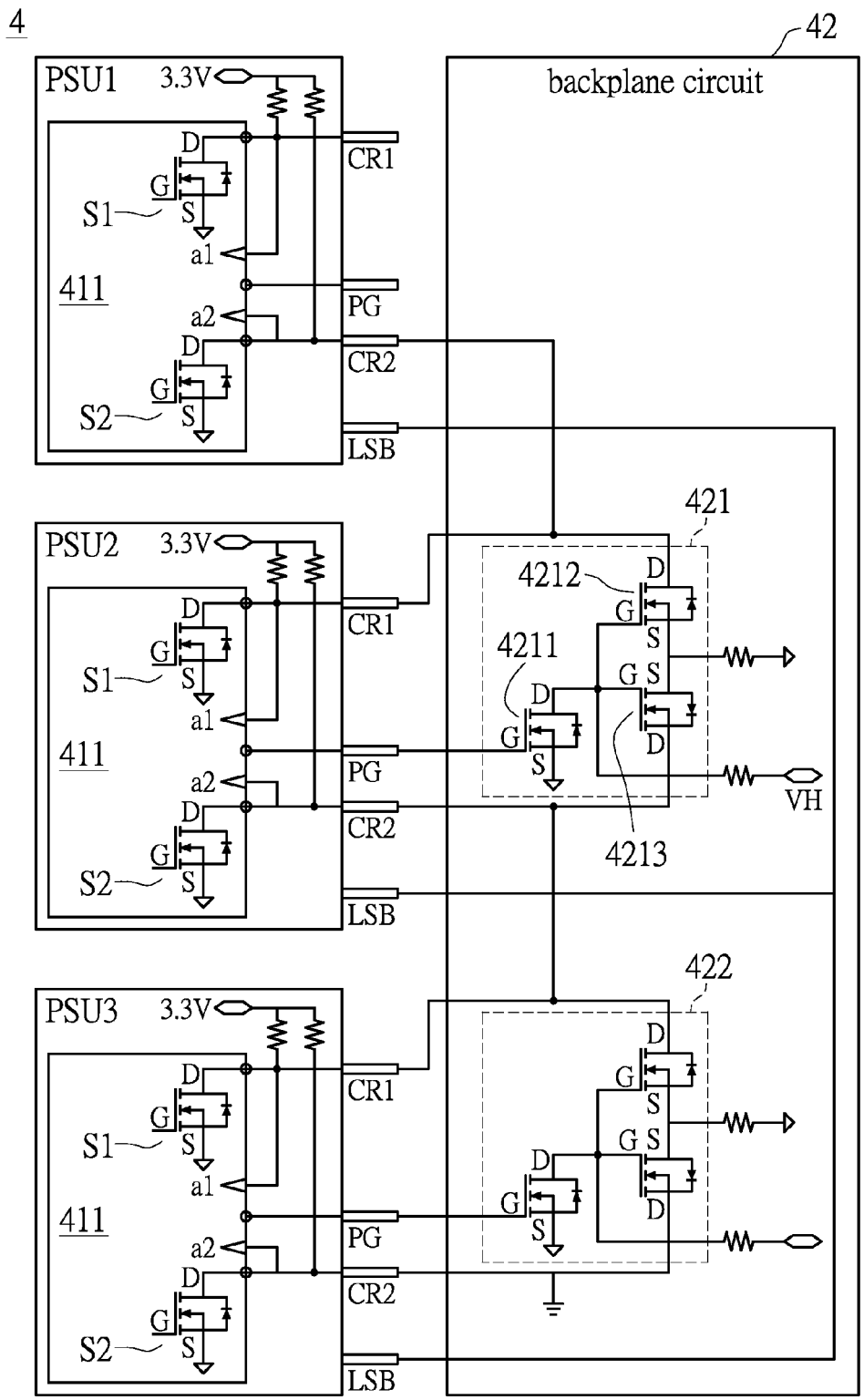
FIG. 4 shows a detailed circuit diagram of a power supply system according to an embodiment of the instant disclosure.

Please refer to FIG. 4 showing a detailed circuit diagram of a power supply system according to an embodiment of the instant disclosure. In this embodiment, the power supply system with three power supplies is described for example. In FIG. 4, the power supply system 4 comprises power supplies PSU1, PSU2, PSU3 and a backplane circuit 42.

Each power supply PSU1, PSU2 or PSU3 has a control unit 411, and the control unit 411 shown in FIG. 4 is an embodiment of the control unit 311 of FIG. 2A. Regarding the power supply PSU1, the first communication port CR1 is electrically connected to the switch S1 and the input terminal a1 of the control unit 411, the second communication port CR2 is electrically connected to the switch S2 and the input terminal a2 of the control unit 411. When there is only the power supply PSU1 operating in active mode, the switch S1 is turned off to make the first communication port CR1 be in the high voltage level (3.3V, or indicated as CR1=1), the switch S2 is turned on to make the second communication port CR2 be in the low voltage level (grounding, or indicated as CR2=0). When the power supply PSU1 is going to wake up the next stage power supply PSU2, the control unit 411 of the power supply PSU1 temporarily turns off the switch S2 in order to temporarily change the voltage of the second communication port CR2 of the power supply to high voltage level (3.3V, or indicated as CR2=1), then the input terminal a1 of the control unit 411 of the power supply PSU2 receives an input signal at high voltage level to change the operation of the power supply PSU2 to active mode. In the same way, when the power supply PSU2 is going to wake up the next stage power supply PSU3, the manner of the signal transmission is similar, and need not be repeated. On the contrary, when the power supplies PSU2, PSU3 are both wakened up, if the power supply PSU3 is going to change the operation from active mode to sleep mode, the control unit 411 of the power supply PSU3 temporarily turns on the switch S1 to temporarily change the voltage of the second communication port CR2 of the power supply PSU2 to low voltage level (grounding, or indicated as CR2=0), then the input terminal a2 of the control unit 411 of the power supply PSU2 receives the input signal at low voltage level, thereby the power supply PSU2 can be informed that the power supply PSU2 itself has become the last stage power of the power supplies operating in active mode. In the same way, when the power supply PSU2 is going to change its operation from active mode to sleep mode, the power supply PSU2 can then inform the power supply PSU1 that the power supply PSU1 itself has become the last stage power of the power supplies operating in active mode. It is worth mentioning that only when the power supply is the last stage power supply of the power supplies operating in active mode, does the last stage power supply output the wake-up signal or the sleep signal, and the other power supplies stay in a state of receiving a wake-up signal or sleep signal. Therefore, the configuration and the setup of each power supply can be the same, and the control unit (411) of each power supply operates and changes the operation mode according to the signal status of the first communication port CR1 and the second communication port CR2. The power supplies in the cascading communication architecture can change the operation modes according to the wake-up signal or the sleep signal outputted from the last stage power supply of the power supplies operating in active mode, and the system operator does not need to set the power supplies individually.

Furthermore, the power supplies PSU1, PSU2, PSU3 are electrically connected to the backplane circuit 42. The backplane circuit 42 has analog switches 421, 422. The analog switches 421, 422 may be implemented by other types of switches (including either a software switch or a hardware switch which could achieve a similar function), but the instant disclosure is not so limited. The backplane 42 is coupled to the second communication port CR2 of the power supply PSU1 and the first communication port CR1 of the power supply PSU3 through the analog switch 421. The analog switch 422 is the same as the analog switch 421, and when a fourth power supply PSU4 is added the analog switch 422 is for coupling the second communication port CR2 of the power supply PSU2 and the first communication port CR1 of the power supply PSU4. If the power supply system has more power supplies and more analog switches accordingly, the coupling manner is similar, need not be repeated. Further, when the power supply PSU2 is electrically connected to the backplane circuit 42, the voltage of the terminal PG received by the analog switch 421 is high voltage level (that is setting PG=1). When one middle stage power supply (for example, the power supply PSU2 in FIG. 4) is shutdown, the voltage of the terminal PG received by the analog switch 421 would be changed (for example, grounding, that is setting PG=0), then the analog switch (421) of the backplane circuit 42 conducts the second communication port CR2 of the previous stage power supply (PSU1) to electrically couple to the first communication port CR1 of the next stage power supply (PSU3). In detail, when PG=0, the switch 4211 is turned off, and then the switches 4212, 4213 are turned on by a voltage signal VH, thus the second communication port CR2 of the previous stage power supply (PSU1) and the first communication port CR1 of the next stage power supply (PSU3) would be coupled together. The switching manner of the aforementioned analog switches 421, 422 will be further described in the embodiment of FIG. 6A, 6B, 6C thereafter. In the same way, for the scenario of more than three power supplies, the function of the analog switch 422 is similar to that of the analog switch 421, and need not be repeated herein. Accordingly, the backplane circuit 42 could maintain the physical connection of the cascading communication architecture even when any middle stage power supply is temporarily shutdown or removed. Therefore, in the power supply system that provides hot-swappable redundant power supplies, one of the power supplies may be removed and serviced while the remaining power supply continues to power the power supply system when a malfunction happens to one of the power supplies.

[An Embodiment of Control Method of a Power Supply System]

Figure 5A:
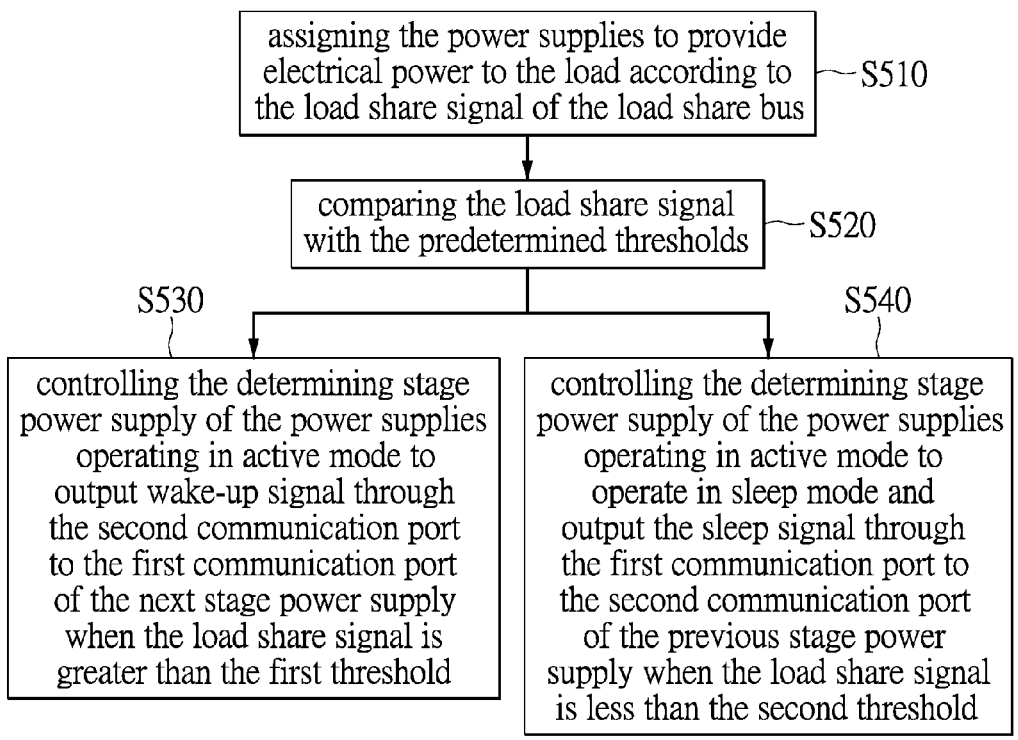
FIG. 5A shows a flow chart of a control method of a power supply system according to an embodiment of the instant disclosure.

Please refer to FIG. 5A showing a flow chart of a control method of a power supply system according to an embodiment of the instant disclosure. The control method of a power system can be applied to the power supply system 3 shown in FIG. 2A or the power supply system 4 shown in FIG. 4 of the previous embodiment. The power supply system may comprise at least two power supplies. The power supplies are electrically connected to a load share bus, and are electrically coupled in parallel to output electrical power to a load. Each power supply comprises a first communication port (CR1) and a second communication port (CR2). The first communication port (CR1) of each power supply is coupled to the second communication port (CR2) of the previous stage power supply. The second communication port (CR2) of each power supply is coupled to the first communication port (CR1) of the next stage power supply to establish a cascading communication architecture. The control method comprises the following steps. First, in step S510, assigning the power supplies to provide electrical power to the load according to the load share signal of the load share bus. In one embodiment, the load share signal may be a voltage, the mentioned voltage may be proportional to the loading of the power supply system.

Then, in step S520, comparing the load share signal with the predetermined thresholds. The number of aforementioned thresholds can be plural depending on practical applications. When the load share signal is greater than a first threshold, conduct step S530, controlling the determining-stage (last stage) power supply of the power supplies operating in active mode to output the wake-up signal (AW) through the second communication port (CR2) to the first communication port (CR1) of the next stage power supply for controlling the operation of the next power supply from sleep mode to active mode. Otherwise, when the load share signal is less than a second threshold, conduct step S540, controlling the determining-stage (last stage) power supply of the power supplies operating in active mode to operate in sleep mode and output the sleep signal (SL) through the first communication port (CR1) to the second communication port (CR2) of the previous stage power supply.

Figure 5B:
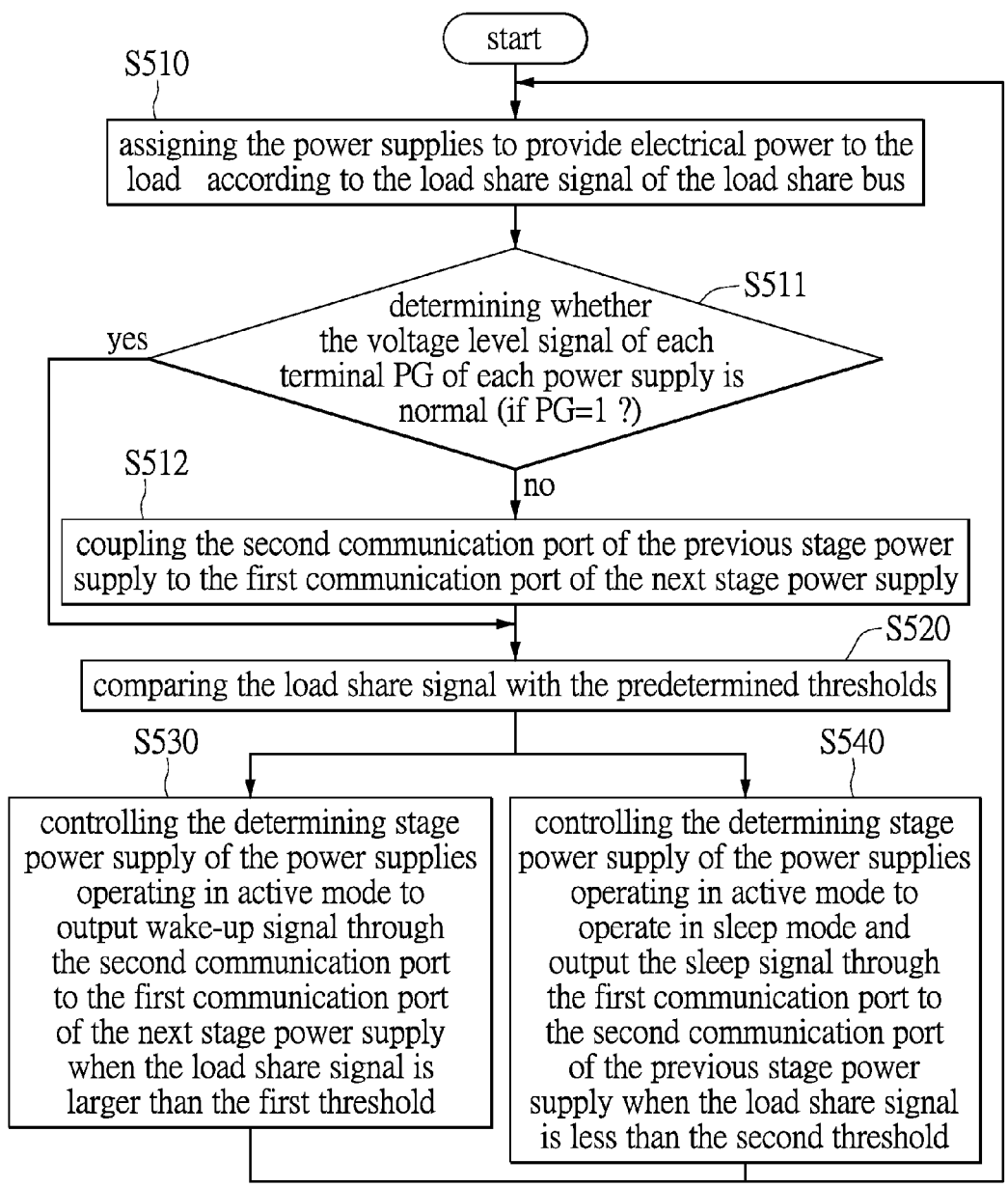
FIG. 5B shows a flow chart of a control method of a power supply system according to another embodiment of the instant disclosure.

Additionally, in the scenario where the power supply comprises the backplane circuit 42 (comprising the analog switches 421, 422) shown in FIG. 4, the flow chart shown in FIG. 5A can be amended to the flow chart shown in FIG. 5B where steps S511, S512 are added. First, in step S510, assigning the power supplies to provide electrical power to the load according to the load share signal of the load share bus. Then, the connection relationship between the second communication port CR2 of each power supply and the first communication port CR1 of the next stage power supply should be verified, and the connection relationship between the first communication port CR1 of each power supply and the second communication port CR2 of the previous stage power supply should be verified also, thus step S511 is conducted to determine whether the voltage level signal of each terminal PG (ie POWER GOOD) of each power supply is normal (that is determining whether PG=1). The normal voltage signal of the terminal PG of each power supply represents that the connection relationship between the second communication port CR2 of each power supply and the first communication port CR1 of the next stage power supply are not broken off, and the connection relationship between the first communication port CR1 of each power supply and the second communication port CR2 of the previous stage power supply are not broken off, then the subsequent steps S520, S530 or S540 can be conducted. The steps S520, S530 and S540 shown in FIG. 5B are the same as the description in FIG. 5A, so need not be repeated. Otherwise, when a middle stage power supply is shutdown (PG 1), utilizing the backplane circuit 42 (comprising the analog switches 421, 422) to couple the second communication port CR2 of the previous stage power supply to the first communication port CR1 of the next stage power supply. Accordingly, the connection relationship between the second communication port CR2 and the first communication port CR1 of the cascading power supplies operating normally would not be broken off. After step S512, conducting steps S520, S530 and S540. Then, step S510 can be conducted again after steps S530, S540.

In the following, the control method of the power supply system in this embodiment applied to the 2+1 redundant power supply system will be described, and FIGS. 6A, 6B, 6C, 7A, 7B, and 7C are referred to.

Figure 6A:
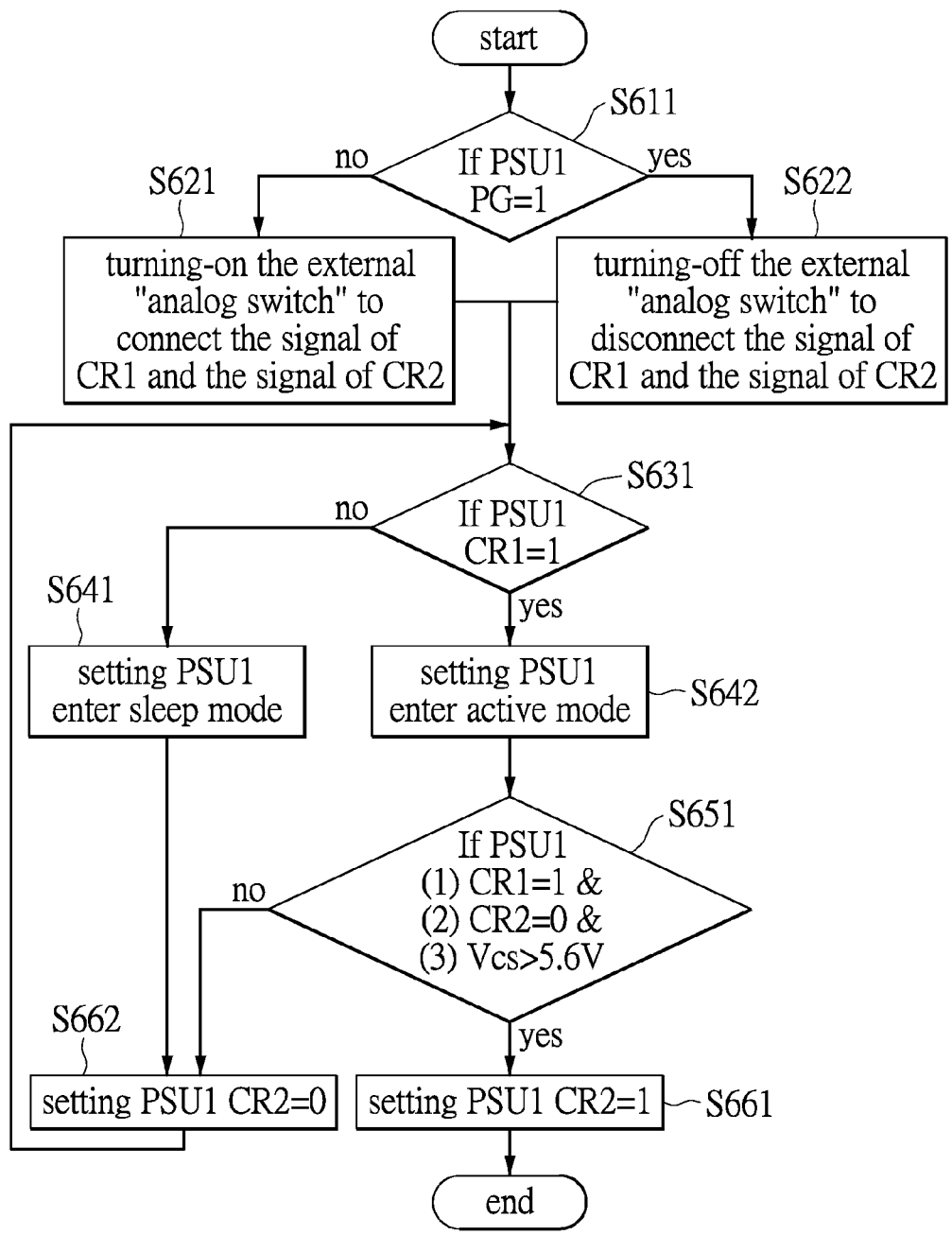
FIGS. 6A, 6B and 6C shows a flow chart of a control method of the power supplies of a 2+1 power supply system sequentially entering active mode according to an embodiment of the instant disclosure.
Figure 6B:
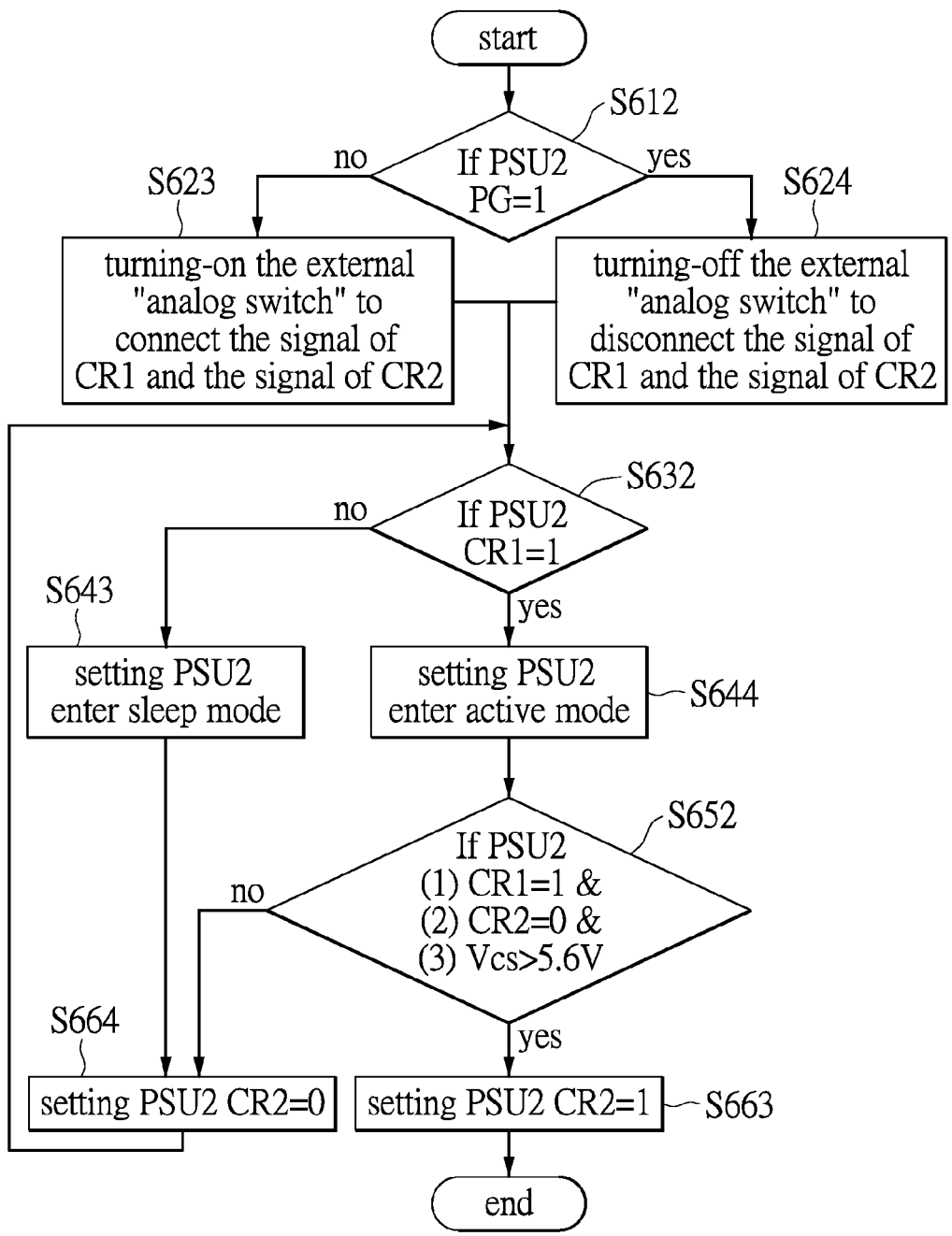
Figure 6C:
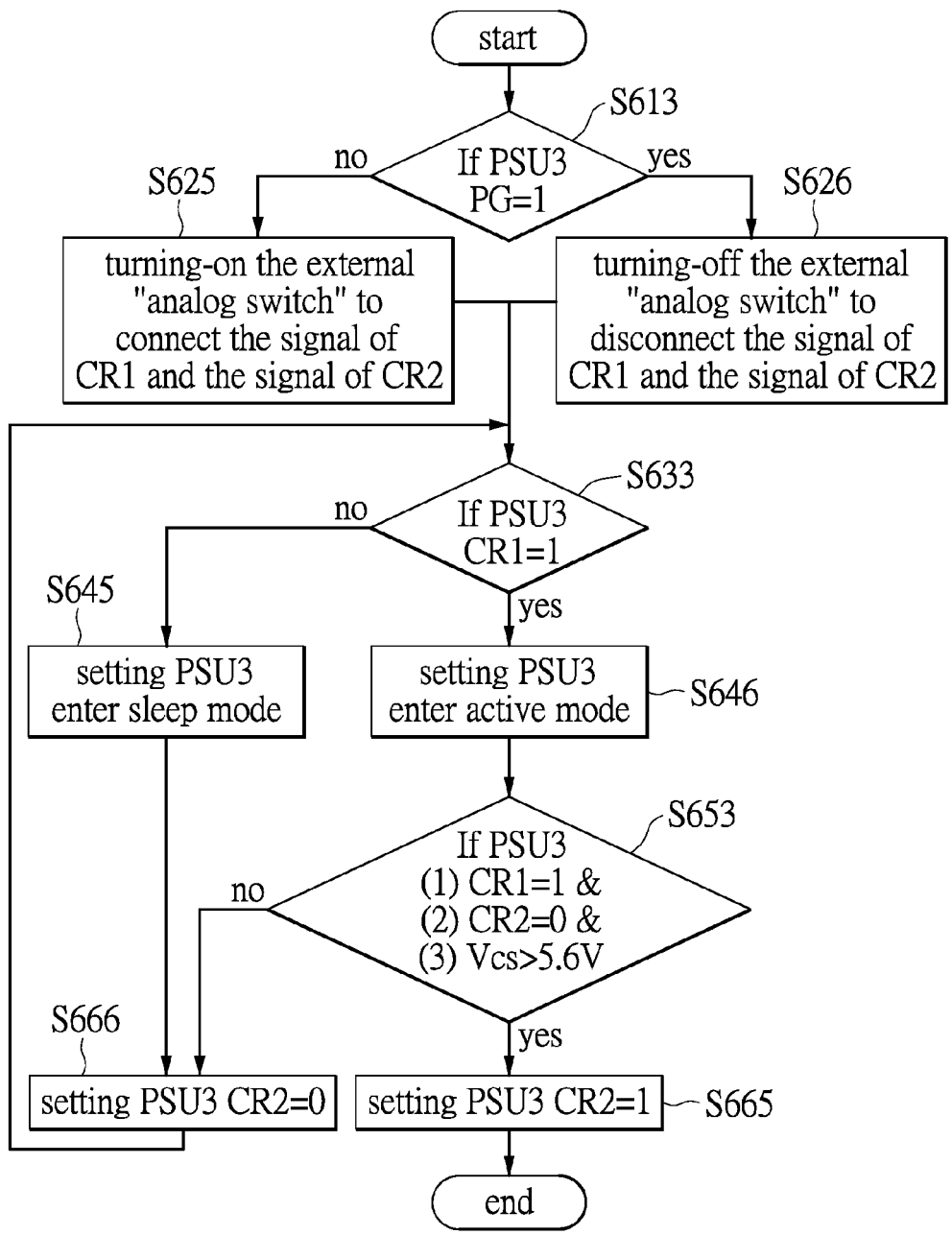

Please refer to FIG. 4 in conjunction with FIGS. 6A, 6B and 6C. FIGS. 6A, 6B and 6C show a flow chart of the power supplies of a control method of a 2+1 redundant power supply system sequentially entering active mode according to an embodiment of the instant disclosure. The three power supplies enter active mode in sequence, and the cascading communication architecture of the power supplies are sequentially presented by the power supply PSU1, the power supply PSU2 and the power supply PSU3 shown in FIG. 4. When the power supply PSU1 is already operating in active mode, in an orderly manner, then the power supply PSU2 and the power supply PSU3 can enter active mode in sequence. At first, the initial steps S611, S612 and S613 are executed for determining whether the power supplies are operated in the normal situation. Refer to FIG. 6A, in step S611 to determine whether the voltage level signal of the terminal PG of the power supply PSU1 is normal (PG=1). When PG=1 (indicating the normal power state), conducting step S622, turning off the external "analog switch" to disconnect the signal of the first communication port CR1 and the signal of the second communication port CR2 of the power supply PSU1. It is worth mentioning that the "analog switch" may be the analog switch 421 shown in FIG. 4. Otherwise, when PG 1, conducting step S621, turning on the external "analog switch" to connect the signal of the first communication port CR1 and the signal of the second communication port CR2 of the power supply PSU1. Regarding the backplane circuit 42 of FIG. 4 comprising at least one switch (such as the analog switches 421, 422), the switch (such as the analog switch 421 or the analog switch 422) is utilized for electrically conducting the signal of the first communication port CR1 with the signal of the second communication port CR2 of the corresponding power supply (such as the power supply PSU2 or the power supply PSU3) when the switch is turned on. Then, refer to FIG. 6B, in step S612, determining whether the voltage level signal of the terminal PG of the power supply PSU2 is normal. When PG=1, conducting step S624, turning off the external "analog switch" (such as the analog switch 421) to disconnect the signal of the first communication port CR1 and the signal of the second communication port CR2 of the power supply PSU2. Otherwise, when PG≠1, conducting step S623, turning on the external "analog switch" (such as the analog switch 421 shown in FIG. 4) to connect the signal of the first communication port CR1 and the signal of the communication port CR2 of the power supply PSU2, so that the electrical connection relationship between the second communication port CR2 of the power supply PSU1 and the first communication port CR1 of the power supply PSU2 is extended to the second communication port CR2 of the power supply PSU2, and the connection relationship is further extended to the first communication port CR1 of the power supply PSU3. Referring to FIG. 6C, in step S613, determining the voltage level signal of the terminal PG of the power supply PSU3 is normal. When PG=1, conducting step S626, turning off the external "analog switch" (such as the analog switch 422 shown in FIG. 4) to disconnect the signal of the first communication port CR1 and the signal of the second communication port CR2 of the power supply PSU3. Otherwise, when PG≠1, conducting step S625, turning on the external "analog switch" (such as the analog switch 422) to connect the signal of the first communication port CR1 and the signal of the second communication port CR2 of the power supply PSU3. The aforementioned steps are executed for determining the voltage level signal of the terminal PG of each power supply, and for maintaining the signal connection relationship of the communication ports of the power supplies between each stage (without breaking off), that is, corresponding to steps S511 and S512 of FIG. 5B.

Then, referring to FIG. 6A again, regarding to power supply PSU1, after step S621 and S622, conducting step S631, determining the logic state of the first communication port CR1 of the power supply PSU1. For example, when CR1=1, conducting step S642, setting the power supply PSU1 to enter active mode. Otherwise, when CR1≠1, conducting step S641, setting the power supply PSU1 to enter sleep mode. After step S641, conducting step S662, setting the logic state of the second communication port CR2 of the power supply PSU1 to be CR2=0. After step S642, conducting step S651, determining the logic state of the first communication port CR1 and the second communication port CR2 of the power supply PSU1, and determining whether the voltage Vcs of the load share signal is greater than the predetermined threshold. For example, determining whether CR1=1, whether CR2=0, and whether the voltage Vcs of the load share signal is greater than the threshold of approximately 5.6V, wherein the threshold of approximately 5.6V represents 70% to 80% (as an example) of full loading of the power supply system. When CR1=1 and CR2=0, it indicates that the power supply PSU1 is the last stage power supply of the power supplies operating in active mode in the cascading communication architecture. Furthermore, when the voltage Vcs of the load share signal is greater than the threshold of approximately 5.6V, it indicates that the next stage power supply PSU2 is required to enter active mode for increasing the power efficiency. Therefore, conducting step S661, setting the logic state of the second communication port CR2 of the power supply PSU1 as CR2=1. Accordingly, the first communication port CR1 of the power supply PSU2 can detect the logic state of the second communication port CR2 of the power supply PSU1, and when detecting the logic state of the second communication port CR2 of the power supply PSU1 as CR2=1, the power supply PSU2 enters active mode (please refer descriptions about FIG. 6B thereinafter). Otherwise, if the conditions of step S651 is not satisfied, conducting step S662, setting the logic state of the second communication port CR2 of the power supply PSU1 as CR2=0. After step S662, conducting step S631 again.

Then, regarding to power supply PSU2, please refer to FIG. 6B. After step S623 and step S624, conducting step S632 for determining logic state of the first communication port CR1 of the power supply PSU2. For example, when CR1=1, conducting step S644, setting power supply PSU2 to enter active mode. Otherwise, when CR1≠1, conducting step S643, setting power supply PSU2 to enter sleep mode. After step S643, conducting step S664, setting the logic state of the second communication port CR2 of the power supply PSU2 as CR2=0. After step S644, conducting step S652, determining logic state of the first communication port CR1 and the second communication port CR2 of the power supply PSU2, and determining whether the voltage Vcs of the load share signal is greater than the predetermined threshold. For example, determining whether CR1=1, whether CR2=0, and whether the voltage Vcs of the load share signal is greater than the threshold of approximately 5.6V, wherein the threshold of approximately 5.6V represents 70% to 80% (as an example) of full loading of the power supply system. When CR1=1 and CR2=0, it indicates that the power supply PSU2 is the last stage power supply of the power supplies operating in active mode in the cascading communication architecture. Furthermore, when the voltage Vcs of the load share signal is greater than the threshold of approximately 5.6V, it indicates that the next stage power supply PSU3 is required to enter active mode for increasing the power efficiency. Therefore, conducting step S663, setting the logic state of the second communication port CR2 of the power supply PSU2 as CR2=1. Accordingly, the first communication port CR1 of the power supply PSU3 can detect the logic state of the second communication port CR2 of the power supply PSU2, and when detecting the logic state of the second communication port CR2 of the power supply PSU2 as CR2=1, the power supply PSU3 enters active mode (please refer descriptions about FIG. 6C thereinafter). Otherwise, if the conditions of step S652 is not satisfied, conducting step S664, setting the logic state of the second communication port CR2 of the power supply PSU2 as CR2=0. After step S664, conducting step S632 again.

According to FIGS. 6A, 6B and 6C, it can be seen that a flow chart of the control method of the PSU2 is the same as that of the PSU1. Similarly, a flow chart of the control method of the PSU3 is the same as that of the PSU1. Thus, in the same way, regarding to power supply PSU3, please refer to FIG. 6C. After step S625 and step S626, conducting step S633, determining logic state of the first communication port CR1 of the power supply PSU3. For example, when CR1=1, conducting step S646, setting power supply PSU3 to enter active mode. Otherwise, when CR1≠1, conducting step S645, setting power supply PSU3 to enter sleep mode. After step S645, conducting step S666, setting the logic state of the second communication port CR2 of the power supply PSU3 as CR2=0. After step S646, conducting step S653, determining logic state of the first communication port CR1 and the second communication port CR2 of the power supply PSU3, and determining whether the voltage Vcs of the load share signal is greater than the predetermined threshold. For example, determining whether CR1=1, whether CR2=0, and whether the voltage Vcs of the load share signal is greater than the threshold of approximately 5.6V, wherein the threshold of approximately 5.6V represents 70% to 80% (as an example) of full loading of the power supply system. When CR1=1 and CR2=0, it indicates that the power supply PSU3 is the last stage power supply of the power supplies operating in active mode in the cascading communication architecture. Furthermore, when the voltage Vcs of the load share signal is greater than the threshold of approximately 5.6V, it indicates that the next stage (if it exists) power supply (for example power supply PSU4) is required to enter active mode for increasing the power efficiency. Therefore, conducting step S665, setting the logic state of the second communication port CR2 of the power supply PSU3 as CR2=1. Otherwise, if the conditions of step S653 is not satisfied, conducting step S666, setting the logic state of the second communication port CR2 of the power supply PSU3 as CR2=0. After step S666, conducting step S633 again.

Figure 7A:
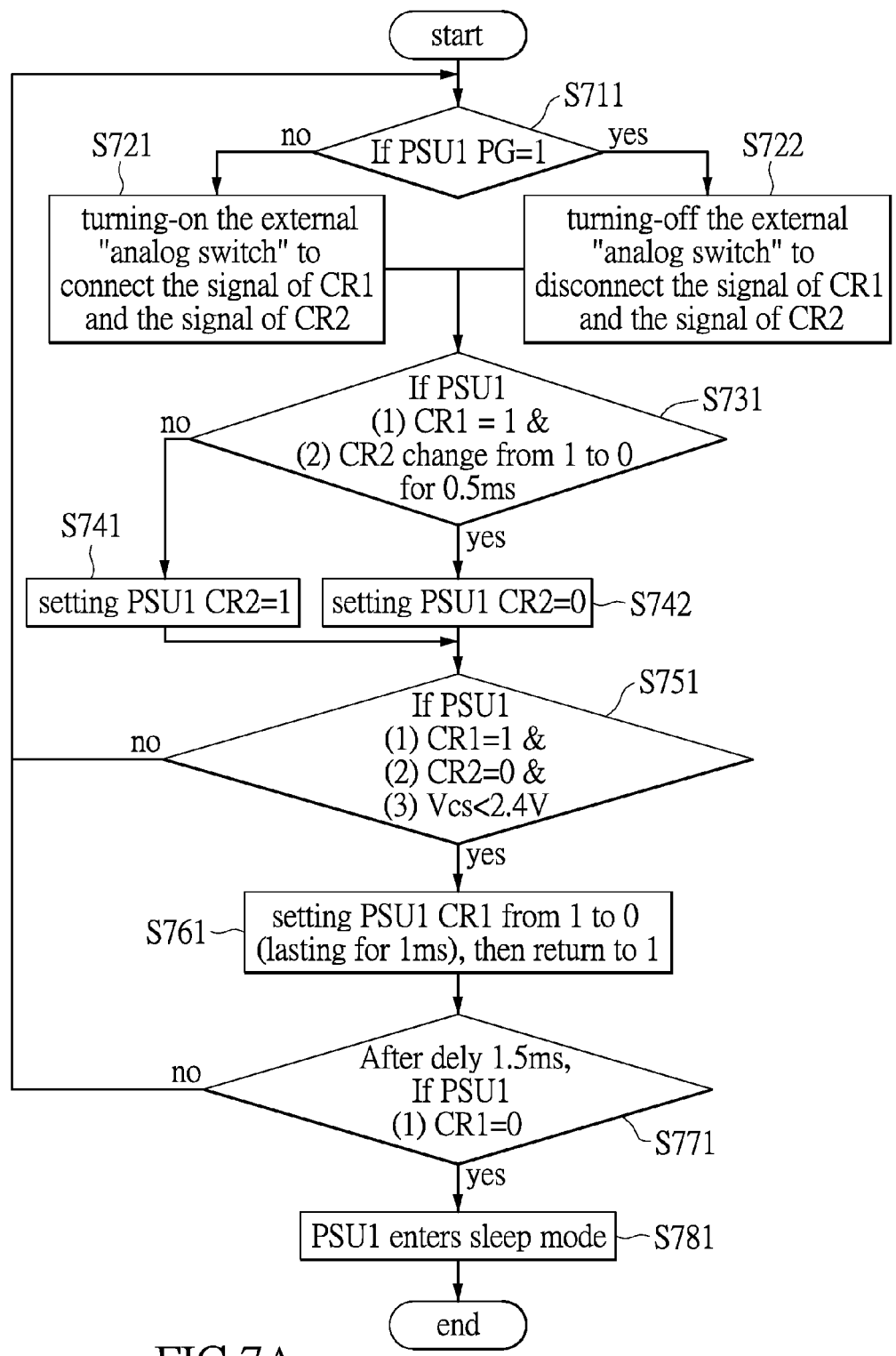
FIGS. 7A, 7B and 7C shows a flow chart of a control method of the power supplies of a 2+1 power supply system entering sleep mode in reverse order according to an embodiment of the instant disclosure.
Figure 7B:
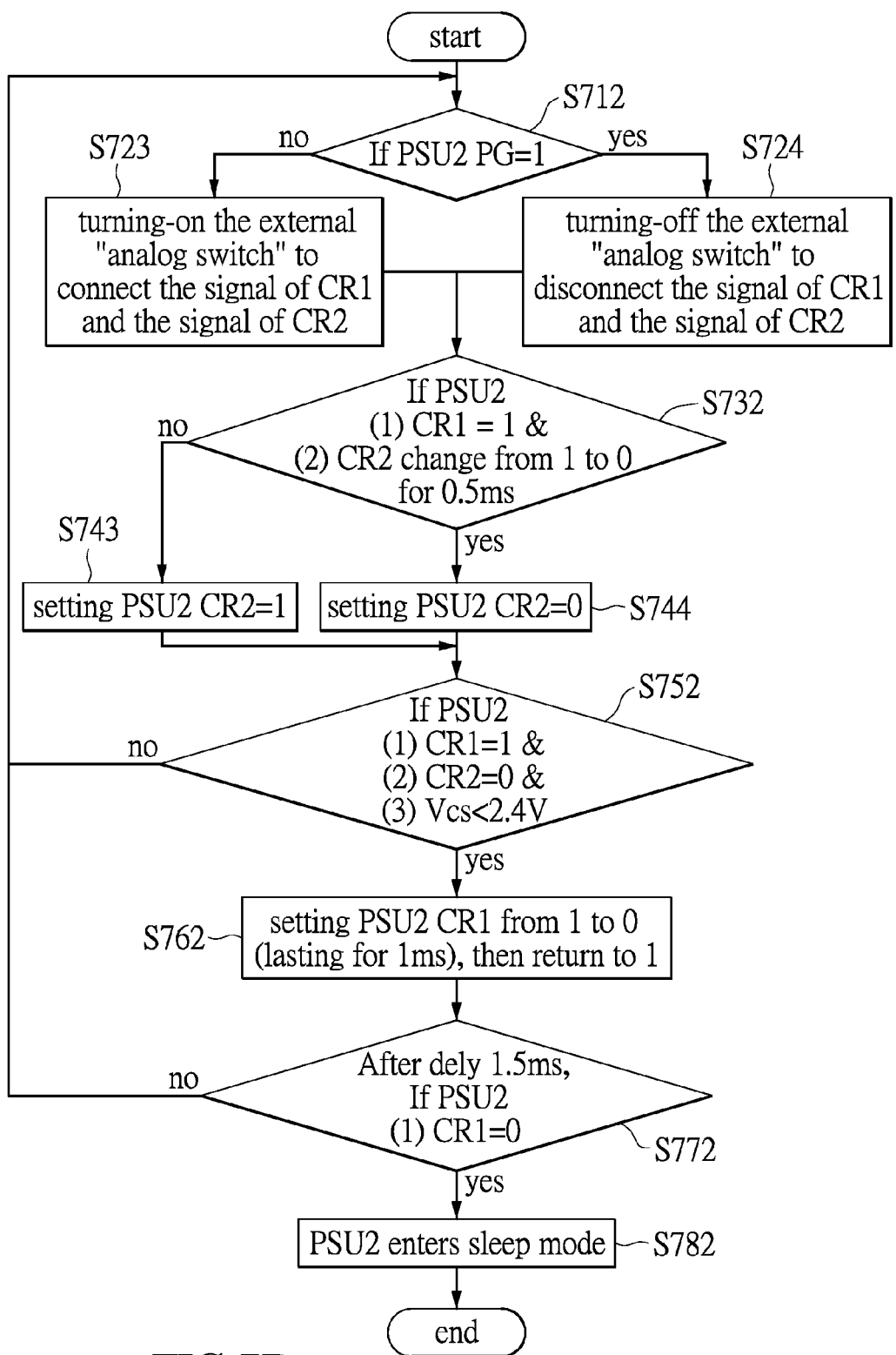
Figure 7C:
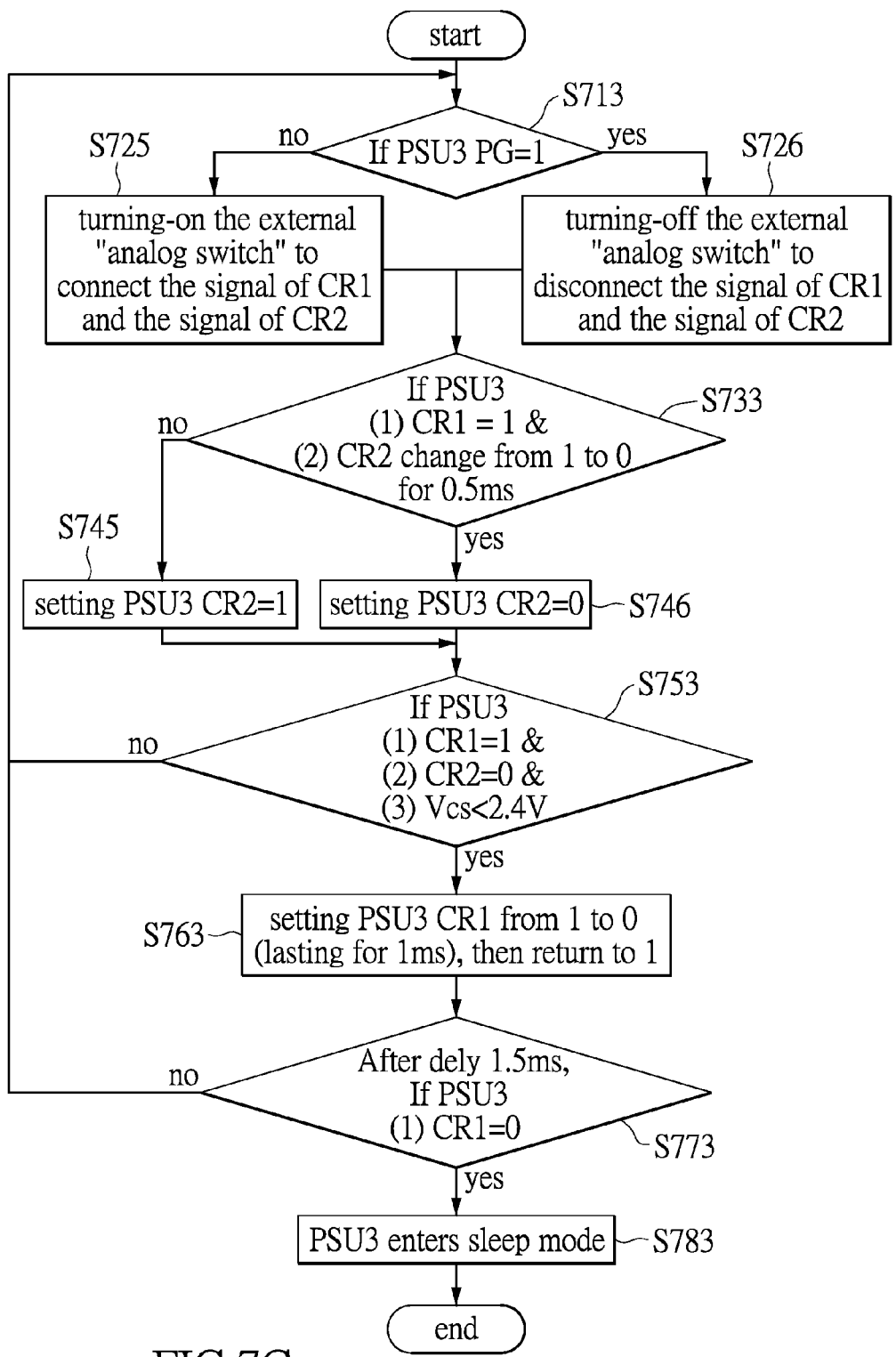

FIGS. 7A, 7B and 7C show a flow chart of the power supplies of a control method of a 2+1 power supply system entering sleep mode in reverse order according to an embodiment of the instant disclosure. When the loading decreases, the power supplies PSU1, PSU2, PSU3 enter sleep mode in reverse order. The power supply PSU3 enters sleep mode first, then the power supply PSU2 enters sleep mode, and so on. At first, steps S711, S712 and S713 are executed for determining whether the power supplies are operated in the normal situation. Steps S711, S721, S722 of FIG. 7A are respectively the same as steps S611, S621, S622 of FIG. 6A. Steps S712, S723, S724 of FIG. 7B are respectively the same as steps S612, S623, S624 of FIG. 6B. Steps S713, S725, S726 of FIG. 7C are respectively the same as steps S613, S625, S626 of FIG. 6C.

Then, conducting step S731 (in FIG. 7A), step S732 (in FIG. 7B), step S733 (in FIG. 7C) for respectively determining the logic state of the first communication ports CR1 of the power supplies PSU1, PSU2, PSU3. Steps S731, S741, S742 of FIG. 7A are respectively the same as steps S631, S641, S642 of FIG. 6A. Steps S732, S743, S744 of FIG. 7B are respectively the same as steps S632, S643, S644 of FIG. 6B. Steps S733, S745, S746 of FIG. 7C are respectively the same as steps S633, S645, S646 of FIG. 6C.

For ease of explanation and fluency in description, referring to FIG. 7C first. When the loading decreases, power supply PSU3 is the first one to enter sleep mode. Conducting step S733 for determining whether the power supply PSU3 satisfies the following conditions: (1) the logic state of the first communication port CR1 is 1; and (2) the logic state of the second communication port CR2 changes from 1 to 0 for lasting approximately 0.5 ms. When the conditions are satisfied, it indicates that there is a sleep signal (SL) transmitted from the next stage power supply to the second communication port CR2 of the power supply PSU3. Then, conducting step S746, setting the logic state of the second communication port CR2 of the power supply PSU3 as CR2=0, wherein at the same time the power supply PSU3 is the last stage power supply of the power supplies operating in the active mode in the cascading communication architecture. Otherwise, if the conditions of step S733 is not satisfied, conducting step S745, setting the logic state of the second communication port CR2 of the power supply PSU3 as CR2=1.

Then, in step S753, determining the logic state of the first communication port CR1 and the second communication port CR2 of the power supply PSU3, and determining whether the voltage Vcs of the load share signal is less than the predetermined threshold. For example, determining whether CR1=1, whether CR2=0, and whether the voltage Vcs of the load share signal is less than the threshold of approximately 2.4V, wherein the threshold of approximately 2.4V represents 30% to 40% (as an example) of full loading of the power supply system. When CR1=1 and CR2=0, it indicates that the power supply PSU3 is the last stage power supply of the power supplies operating in active mode in the cascading communication architecture. Furthermore, when the voltage Vcs of the load share signal is less than the threshold of approximately 2.4V, it indicates that the power supply PSU3 is required to enter sleep mode for increasing the power efficiency. Therefore, conducting step S763, setting the logic state of the first communication port CR1 of the power supply PSU3 to change from 1 to 0 for lasting approximately 1 ms, and then returning to 1. Step S763 indicates that the power supply PSU3 have to enter sleep mode and the power supply PSU3 informs the situation to the previous stage power supply PSU2. In other words, step S763 is outputting the sleep signal (SL) to the second communication port CR2 of the previous stage power supply PSU2 as mentioned in previous embodiment. When the second communication port CR2 of the power supply PSU2 receives the sleep signal (SL), the power supply PSU2 can force the logic state of its second communication port CR2 to be "0", for indicating that the power supply PSU2 will be the last stage power supply of the power supplies operating in the active mode. Otherwise, when the conditions of step S753 are not satisfied, return to step S713.

Then, after a short delay (lasting approximately 1.5 ms) of the power supply PSU3 at step S773, determining whether logic state of the first communication port CR1 of the power supply PSU3 is "0". When CR1=0, it indicates that the power supply PSU2 has already received the sleep signal (SL) and set the logic state of its second communication port CR2 to be "0". Then, conducting step S783, power supply PSU3 entering sleep mode. Otherwise, when the logic state of the first communication port CR1 of the power supply PSU3 is not "0", it indicates that the power supply PSU2 does not correctly receive the sleep signal (SL), therefore return to step S713.

Then, referring to FIG. 7B, regarding to power supply PSU2, conducting step S732 for determining whether the power supply PSU2 satisfies the following conditions: (1) the logic state of the first communication port CR1 is 1; and (2) the logic state of the second communication port CR2 changes from 1 to 0 for lasting approximately 0.5 ms. When the conditions are satisfied, it indicates that the next stage power supply PSU3 transmits the sleep signal (SL) to the second communication port CR2 of the power supply PSU2. Then, conducting step S744, setting the logic state of the second communication port CR2 of the power supply PSU2 as CR2=0, wherein at the same time the power supply PSU2 is the last stage power supply of the power supplies operating in the active mode. Otherwise, if the conditions of step S732 is not satisfied, conducting step S743, setting the logic state of the second communication port CR2 of the power supply PSU2 as CR2=1.

Then, in step S752, determining the logic state of the first communication port CR1 and the second communication port CR2 of the power supply PSU2, and determining whether the voltage Vcs of the load share signal is less than the predetermined threshold. For example, determining whether CR1=1, whether CR2=0, and whether the voltage Vcs of the load share signal is less than the threshold of approximately 2.4V, wherein the threshold of approximately 2.4V represents 30% to 40% (as an example) of full loading of the power supply system. When CR1=1 and CR2=0, it indicates that the power supply PSU2 is the last stage power supply of the power supplies operating in active mode in the cascading communication architecture. Furthermore, when the voltage Vcs of the load share signal is less than the threshold of approximately 2.4V, it indicates that the power supply PSU2 is required to enter sleep mode for increasing the power efficiency. Therefore, conducting step S762, setting the logic state of the first communication port CR1 of the power supply PSU2 to change from 1 to 0 for lasting approximately 1 ms, and then returning to 1. Step S762 indicates that the power supply PSU2 have to enter sleep mode and the power supply PSU2 informs the situation to the previous stage power supply PSU1. In other words, step S762 is outputting the sleep signal (SL) to the second communication port CR2 of the previous stage power supply PSU1 as mentioned in previous embodiment. When the second communication port CR2 of the power supply PSU1 receives the sleep signal (SL), the power supply PSU1 can force the logic state of its second communication port CR2 to be "0", for indicating that the power supply PSU1 will be the last stage power supply of the power supplies operating in the active mode. Otherwise, when the conditions of step S752 are not satisfied, return to step S712.

Then, after a short delay (lasting approximately a 1.5 ms) of the power supply PSU2 at step S772, determining whether the logic state of the first communication port CR1 of the power supply PSU2 is "0". When CR1=0, it indicates that the power supply PSU1 has already received the sleep signal (SL) and set the logic state of its second communication port CR2 to be "0". Then, conducting step S782, power supply PSU2 entering sleep mode. Otherwise, when the logic state of the first communication port CR1 of the power supply PSU2 is not "0", it indicates that the power supply PSU1 does not correctly receive the sleep signal (SL), therefore return to step S712.

In the same way, regarding to power supply PSU1, please refer to FIG. 7A. Step S731 is the same as step S732 and step S733. Step S741 is the same as step S743 and step S745. Step S742 is the same as step S744 and step S746. Step S751 is the same as step S752 and step S753. Step S761 is the same as step S762 and step S763. Step S771 is the same as step S772 as step S773. Step S781 is the same as step S782 and step S783. The same principle of operation will not be repeated herein. As shown in FIGS. 7A, 7B and 7C, a flow chart of the control method of the PSU2 is the same as that of the PSU3. Similarly, a flow chart of the control method of the PSU1 is the same as that of the PSU3.

As mentioned above, the power supplies PSU1, PSU2, PSU3 can enter sleep mode in reverse order. According to above descriptions, the provided power supply system and the control method thereof establish the cascading communication architecture by a plurality of power supplies with the same hardware and software architecture, and operations of the power supplies are switched according to the loading status obtained from the load share bus, thereby the consumed energy can be saved. The power supply system and the control method thereof disclosed in the present invention, which provide a redundant power supply system and method without master-slave mechanism, can follow the conventional load share technology, in order to fit in with the demand of conventional functions. Because the architecture and configuration of each power supply are the same, and no setting procedure for each individual power supply is needed, the operator can conduct hot swap for the power supplies of the power supply system during repair or maintenance, there is no need to inform the system of the client. Further, consumed energy could be saved automatically according to auto-switching the operations of the power supplies, there is no need to perform tedious setting from the client, and each power supply can be controlled to operate in higher efficiency loading range (30% to −80% loading, for example). Besides, due to the simple maintenance procedures, shorter maintenance working hour and related labor costs for the client can be obtained. Additionally, the provided power supply system and the control method thereof have high extensibility to support an N+1 power supply system.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A power supply system, comprising:
at least two power supplies, the power supplies electrically connected to a load share bus, electrically coupled in parallel to output electrical power to a load, each power supply dynamically operating in either an active mode or a sleep mode according to the loading status, wherein the last one of the power supplies operating in the active mode is a determining-stage power supply and the determining-stage power supply determines whether to enter into the sleep mode or whether to wake up the next stage power supply in the sleep mode according to the loading status, and each power supply includes:
a control unit, electrically coupled to the load share bus, generating a wake-up signal or a sleep signal according to a load share signal from the load share bus, the load share signal indicating the loading status of the power supply system, wherein when the operation of the power supply changes from the sleep mode to the active mode, the control unit controls the power supply to operate from the sleep mode to the active mode according to the wake-up signal from a previous stage power supply, wherein when the operation of the power supply changes from the active mode to the sleep mode, the control unit generates the sleep signal and outputs the sleep signal to the previous stage power supply;
a first communication port, coupled to the control unit; and
a second communication port, coupled to the control unit;
wherein the first communication port of each power supply is coupled to the second communication port of the previous stage power supply, the second communication port of each power supply is coupled to the first communication port of the next stage power supply to establish a cascading communication architecture;
wherein the first communication port is for receiving the wake-up signal from the second communication port of the previous stage power supply and outputting the sleep signal to the second communication port of the previous stage power supply, the second communication port is for receiving the sleep signal from the first communication port of the next stage power supply and outputting the wake-up signal to the first communication port of the next stage power supply.

2. The power supply system according to claim 1, wherein when the load share signal is greater than a threshold, the control unit of the determining-stage power supply operating in the active mode outputs the wake-up signal through the second communication port to the first communication port of the next stage power supply, in order to control the operation of the next stage power to change from the sleep mode to the active mode.

3. The power supply system according to claim 1, wherein when the load share signal is less than a threshold, the control unit of the determining-stage power supply operating in the active mode outputs the sleep signal through the first communication port to the second communication port of the previous stage power supply, and controls the operation of the corresponding power supply to change from the active mode to the sleep mode.

4. The power supply system according to claim 1, wherein the load share signal is a voltage, the voltage is proportional to the loading of the power supply system.

5. The power supply system according to claim 1, wherein the power supplies enter the active mode in sequence according to increasing of the loading, the power supplies enter the sleep mode in reverse order according to decreasing of the loading.

6. The power supply system according to claim 1, further comprising:
a backplane circuit, coupled to the first communication port and the second communication port of each power supply, wherein when a middle stage power supply is shutdown, the backplane circuit couples the second communication port of the previous stage power supply to the first communication port of the next stage power supply.

7. The power supply system according to claim 6, wherein the backplane circuit comprises at least one switch, for electrically conducting the signal of the first communication port of the corresponding power supply with the signal of the second communication port of the corresponding power supply.

8. The power supply system according to claim 2, wherein the threshold is a voltage value, the threshold voltage represents a predetermined percentage of full loading of the power supply system.

9. The power supply system according to claim 2, wherein the threshold is a voltage value, the voltage value represents 70% to 80% of full loading of the power supply system.

10. The power supply system according to claim 3, wherein the threshold is a voltage value, the voltage value represents 30% to 40% of full loading of the power supply system.

11. A control method of a power supply system, adapted for the power supply system comprising at least two power supplies, the power supplies electrically connected to a load share bus, electrically coupled in parallel to output electrical power to a load, each power supply dynamically operating in either an active mode or a sleep mode according to the loading status, the last one of the power supplies operating in the active mode being a determining-stage power supply, the determining-stage power supply determining whether to enter into the sleep mode or whether to wake up the next stage power supply in the sleep mode according to the loading status, each power supply including a first communication port and a second communication port, the first communication port of each power supply coupled to the second communication port of the previous stage power supply, the second communication port of each power supply coupled to the first communication port of the next stage power supply to establish a cascading communication architecture, the control method comprising:
assigning the power supplies to provide electrical power to the load according to a load share signal of the load share bus;
controlling the determining-stage power supply of the power supplies operating in the active mode to output a wake-up signal through the second communication port to the first communication port of the next stage power supply for controlling the operation of the next power supply from the sleep mode to the active mode when the load share signal is greater than a first threshold; and
controlling the determining-stage power supply of the power supplies operating in the active mode to operate in the sleep mode and output a sleep signal through the first communication port to the second communication port of the previous stage power supply when the load share signal is less than a second threshold.

12. The control method of the power supply system according to claim 11, wherein the load share signal is a voltage, the voltage is proportional to the loading of the power supply system.

13. The control method of the power supply system according to claim 11, further comprising:
utilizing a backplane circuit to couple the first communication port and the second communication port of each power supply, and coupling the second communication port of the previous stage power to the first communication port of the next stage power supply when a middle stage power supply is shutdown.

14. The control method of the power supply system according to claim 13, wherein the backplane comprises at least one switch, the control method further comprises:
turning on the switch, for electrically conducting the signal of the first communication port of the corresponding power supply with the signal of the second communication port of the corresponding power supply.

15. The control method of the power supply system according to claim 11, wherein the step of assigning the power supplies to provide electrical power to the load according to the load share signal of the load share bus further comprises:
controlling at least a portion of the power supplies establishing the cascading communication architecture to operate in the active mode, wherein the determining-stage power supply power supply of the power supplies operating in the active mode is used to inform its sleep mode to the previous stage power supply or wake-up the next stage power supply.

16. The control method of the power supply system according to claim 11, wherein the first threshold and the second threshold are voltage values, wherein the first threshold is substantially the same as the second threshold.

17. The control method of the power supply system according to claim 11, wherein the first threshold and the second threshold are voltage values, the first threshold is different from the second threshold.

18. The control method of the power supply system according to claim 17, wherein the first threshold represents 70% to 80% of full loading of the power supply system.

19. The control method of the power supply system according to claim 17, wherein the second threshold represents 30% to 40% of full loading of the power supply system.

20. The control method of the power supply system according to claim 11, wherein the logic state of the first communication port and the second communication port of the determining-stage power supply power supply of the power supplies operating in the active mode are different.

* * * * *